(12) United States Patent
Hsieh (10) Patent No.: US 8,410,851 B1
(45) Date of Patent: Apr. 2, 2013

(54) SWITCHING AMPLIFIER WITH AN INDUCTOR

(76) Inventor: Wen-Hsiung Hsieh, Keelung (TW)

( * ) Notice: Subject to any disclaimer, the term of this patent is extended or adjusted under 35 U.S.C. 154(b) by 0 days.

(21) Appl. No.: 13/229,779

(22) Filed: Sep. 12, 2011

(51) Int. Cl.
*H03F 3/217* (2006.01)

(52) U.S. Cl. ...................................... 330/251

(58) Field of Classification Search .............. 330/10, 330/207 A, 251
See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | McCorkle | |
| 5,767,740 A | 6/1998 | Fogg | |
| 5,805,020 A | 9/1998 | Danz | |
| 5,949,282 A | 9/1999 | Nguyen | |
| 5,986,498 A | 11/1999 | Rodriguez | |
| 6,304,137 B1 * | 10/2001 | Pullen et al. | 330/251 |
| 6,356,151 B1 | 3/2002 | Nalbant | |
| 6,392,476 B1 | 5/2002 | Rodriguez | |
| 6,489,839 B2 | 12/2002 | Maaskant | |
| 6,496,059 B1 * | 12/2002 | Nguyen | 330/251 |
| 6,563,377 B2 | 5/2003 | Butler | |
| 6,794,932 B1 | 9/2004 | Butler | |
| 6,844,777 B2 | 1/2005 | Kitamura | |
| 6,922,101 B2 | 7/2005 | Bayko | |
| 7,030,694 B2 | 4/2006 | Jonkman | |
| 7,286,008 B2 | 10/2007 | Watts | |
| 7,307,474 B2 | 12/2007 | Nguyen | |
| 7,400,191 B2 | 7/2008 | Rodriguez | |
| 7,633,336 B2 | 12/2009 | Bean | |
| 7,705,672 B1 | 4/2010 | Rodriguez | |
| 7,816,985 B2 | 10/2010 | Attwood | |
| 7,952,426 B2 | 5/2011 | Mun | |
| 7,961,047 B2 | 6/2011 | Pillonnet | |
| 7,969,126 B2 | 6/2011 | Stanley | |
| 8,212,613 B1 * | 7/2012 | Hsieh | 330/251 |
| 8,228,118 B1 * | 7/2012 | Hsieh | 330/251 |
| 2009/0309658 A1 * | 12/2009 | Mendenhall | 330/251 |
| 2010/0182083 A1 * | 7/2010 | Maeda | 330/251 |

* cited by examiner

*Primary Examiner* — Khanh V Nguyen (57) ABSTRACT pa A switching amplifying method or a switching amplifier for obtaining a linearly amplified replica of an input signal, is highly efficient, and does not have the disadvantage of "dead time" problem related to the class D amplifiers. Said switching amplifier comprises: an inductor means; a switching unit for switching a current from a DC voltage to the inductor means; a controllable diodes unit for blocking a current when the current from the DC voltage to the inductor means is switched on, and conducting the current from the inductor means to a filter unit when the current from the DC voltage to the inductor means is switched off; an amplifier control unit to control the switching unit and the controllable diodes unit according to the input signal; the filter unit filtering the output of the controllable diodes unit for getting an output signal.

17 Claims, 5 Drawing Sheets

SWITCHING AMPLIFIER WITH AN INDUCTOR

BACKGROUND OF THE INVENTION (1) Field of the Invention

This invention is related in general to a power amplifier, and more particularly, to a switching amplifier that can efficiently and linearly amplify an input signal having first and second polarities for obtaining a low-distortion output signal.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. Patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces a linearly amplified replica of an input signal, is highly efficient, and does not have the "dead time" problem related to class D amplifiers.

One aspect of the present invention provides a method of obtaining an output signal from a direct current (DC) voltage, wherein the output signal is a linearly amplified replica of an input signal, comprising the steps of: receiving the input signal; transforming and pulse modulating the input signal for generating a pulse modulated signal, wherein the transforming is based on that when applying the direct current (DC) voltage across an inductor means, the energy stored in the inductor means is proportional to the square of time of said applying; switching a current from the direct current (DC) voltage to the inductor means according to the pulse modulated signal; blocking a current from the inductor means to a filter when the current from the direct current (DC) voltage to the inductor means is switched on and conducting the current from the inductor means to the filter when the current from the direct current (DC) voltage to the inductor means is switched off; filtering said current from the inductor means for outputting the output signal by the filter.

Yet another aspect of the present invention provides a switching amplifier further comprising a negative feedback signal generator to generate a negative feedback signal corresponding to the output signal, wherein the amplifier control unit integrates the input signal and the negative feedback signal to process a negative feedback control.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
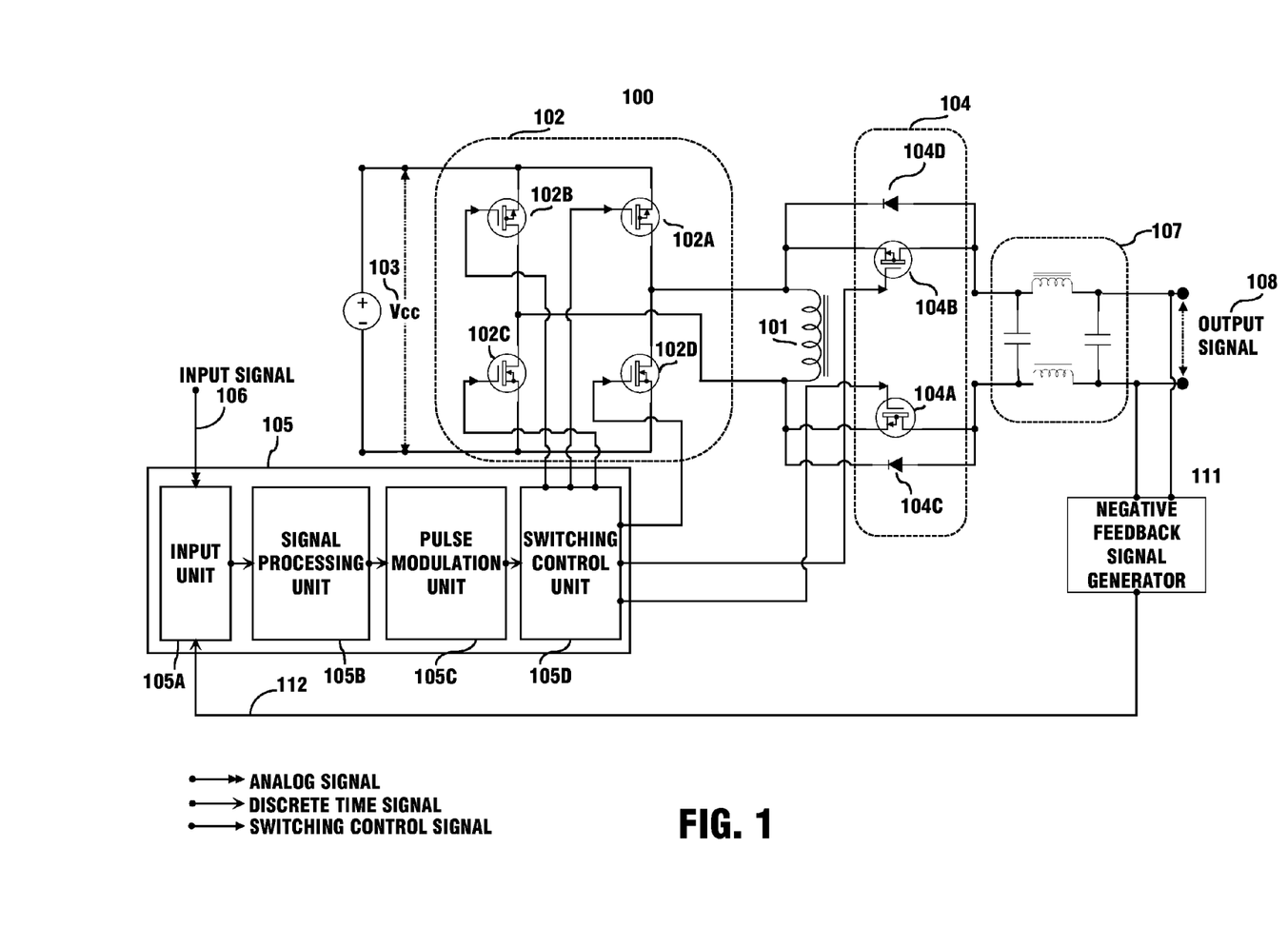
FIG. 1 is an exemplary block and circuit diagram illustrating an embodiment of a switching amplifier in accordance with the present invention, wherein the switching amplifier has switches configured as a full bridge topology.

FIG. 1 is an exemplary block and circuit diagram illustrating an embodiment of a switching amplifier 100 in accordance with the present invention, wherein the switching amplifier 100 having switches 102A, 102B, 102C and 102D configured as a full bridge topology.

As illustrated in FIG. 1, the switching amplifier 100 of the present invention for amplifying an input signal 106 having positive and negative polarities is comprised of: an inductor means 101; a switching unit 102 comprising four switches 102A, 102B, 102C and 102D configured as a full bridge topology for switching a current from a direct current (DC) voltage 103 to the inductor means 101; a controllable diodes unit 104 comprising two switches 104A, 104B and two diodes 104C, 104D; an amplifier control unit 105 for receiving the input signal 106 and coupled to the switches 102A, 102B, 102C and 102D of the switching unit 102 and the switches 104A and 104B of the controllable diodes unit 104 for controlling their switching; a filter unit 107 coupled to the controllable diodes unit 104 and outputting the output signal 108.

In this non-limiting exemplary embodiment, the input signal 106 is an analog signal. However, for an input signal which is a discrete time signal, a corresponding embodiment of a switching amplifier in accordance with this invention is obvious.

As further illustrated in FIG. 1, the inductor means 101 is an inductor operated in discontinuous mode. Accordingly, when the current from the direct current (DC) voltage 103 to the inductor means 101 is switched on, the current from the inductor means 101 to the filter unit 107 is blocked by the controllable diodes unit 104. Therefore, during this switched on period, the current in the inductor means 101 builds up linearly in it from zero to a peak value.

Further, when the current from the direct current (DC) voltage 103 to the inductor means 101 is switched off, the current from the inductor means 101 to the filter unit 107 is conducted by the controllable diodes unit 104 for delivering energy in the inductor means 101 to the filter unit 107.

Therefore, during the period when the current from the direct current (DC) voltage 103 to the inductor means 101 is switched on, the direct current (DC) voltage 103 is applied across the inductor means 101, and the current in the inductor means 101 builds up linearly from zero to a peak value which is proportional to the switched on period. Therefore, during the switched on period, the energy stored in the inductor means 101 is based on the equation:

$$E = \frac{L_p(I_p)^2}{2}$$

Wherein E is the energy stored, $L_p$ is the inductance of the inductor means 101, and $I_p$ is the peak value of the current in the inductor means 101 at the end of the switched on period. Since the peak value $I_p$ is proportional to the switched on period $T_{on}$:

$$I_p \propto T_{on} ==> E \propto (T_{on})^2$$

Therefore, the energy stored into the inductor means 101 during a switched on period is proportional to square of the switched on period.

As further illustrated in FIG. 1, the amplifier control unit 105 comprises an input unit 105A for receiving the input signal 106 and having an analog to digital converter for converting the input signal 106 to a discrete time input signal x[n]

$$x = \{x[n]\}, 0 < n < \infty;$$

a signal processing unit 105B for transforming the discrete time input signal x[n] to a transformed signal y[n] according to the following equation:

$$y[n] = ^2\sqrt{x[n]}, 0 < n < \infty;$$

a pulse modulation unit 105C for getting a pulse modulated signal from pulse modulating the transformed signal y[n] from the signal processing unit 105B; and a switching control unit 105D coupled to the switches 102A, 102B, 102C and 102D of the switching unit 102 and the switches 104A and 104B of the controllable diodes unit 104 to control their switching according to the pulse modulated signal from the pulse modulation unit 105C.

Figure 2:
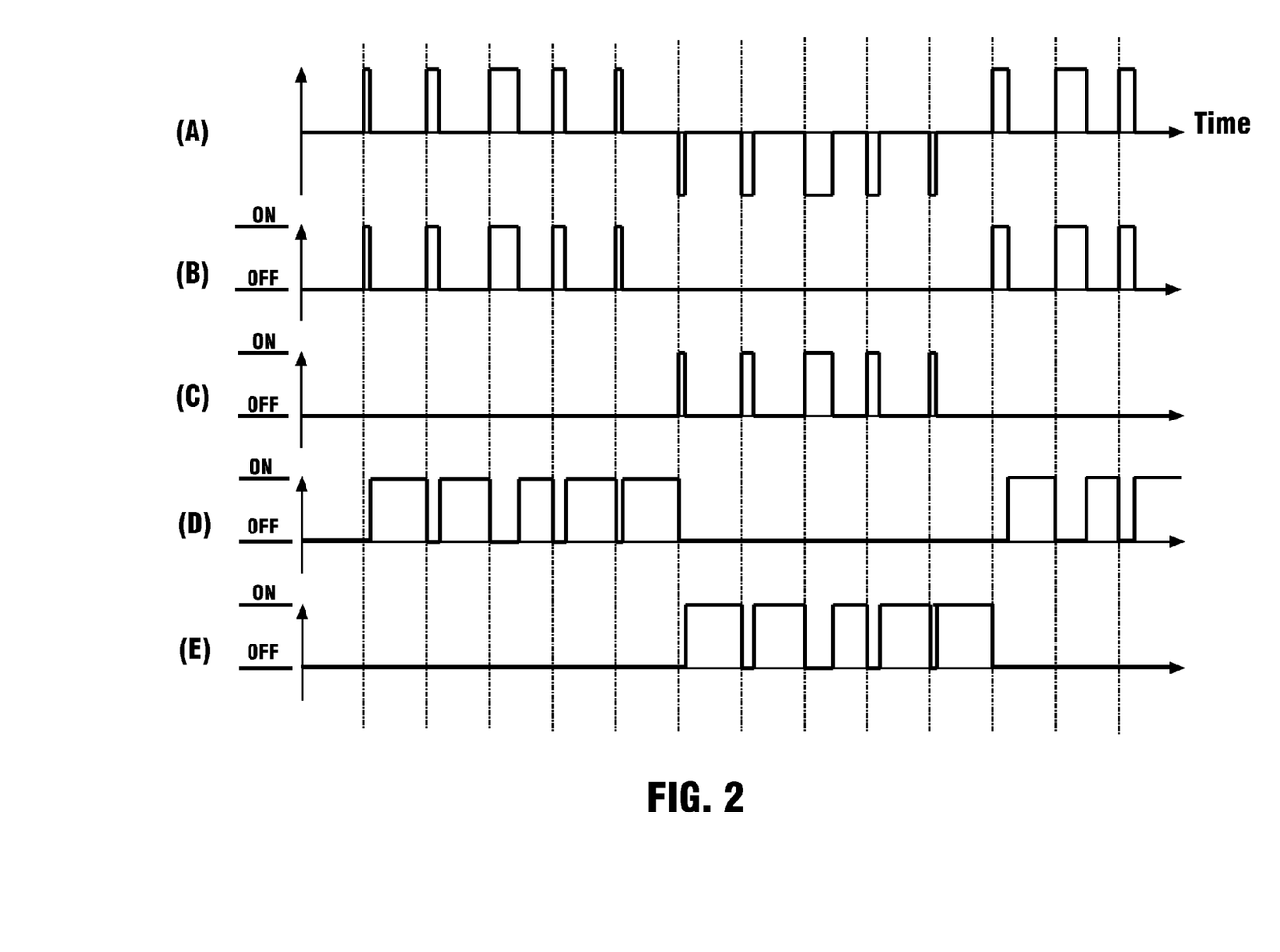
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switches 102A and 102C for controlling their switching are illustrated in FIG. 2(B); and a non-limiting exemplary waveform of switching control signals from the switching control unit 105D to the switches 102B and 102D for controlling their switching are illustrated in FIG. 2(C). Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 1 and FIG. 2, when the input signal 106 is zero, the switches 102A, 102B, 102C and 102D of the switching unit 102 and the switches 104A and 104B of the controllable diodes unit 104 are all switched off. When the input signal 106 is not zero, the switches 102A, 102B, 102C and 102D switch the current from a direct current (DC) voltage 103 to the inductor means 101 according to the pulse modulated signal transformed and pulse modulated from the input signal 106, and the switches 104A and 104B switch for blocking the current from the inductor means 101 to the filter unit 107 when the current from a direct current (DC) voltage 103 to the inductor means 101 is switched on by the switching unit 102, and conducting the current from the inductor means 101 to the filter unit 107 when the current from a direct current (DC) voltage 103 to the inductor means 101 is switched off.

As further illustrated in FIG. 1, the filter unit 107 is a low pass filter to obtain the output signal 108 corresponding to the input signal 106 by filtering the output of the controllable diodes unit 104 and outputting the output signal 108.

As illustrated in FIG. 1 and FIG. 2, the diodes 104C, 104D can be replaced by switches respectively for better power efficiency. Further, it is obvious that the switch 104A and the diode 104C can be configured into a sole switch, the switch 104A and the diode 104C can be configured into a sole switch, either. Furthermore, the controllable diodes unit 104 can be implemented by a solid state relay, a switch that can switch off an alternating current, with fast enough switching speed, although the switching would be a little more complicate.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
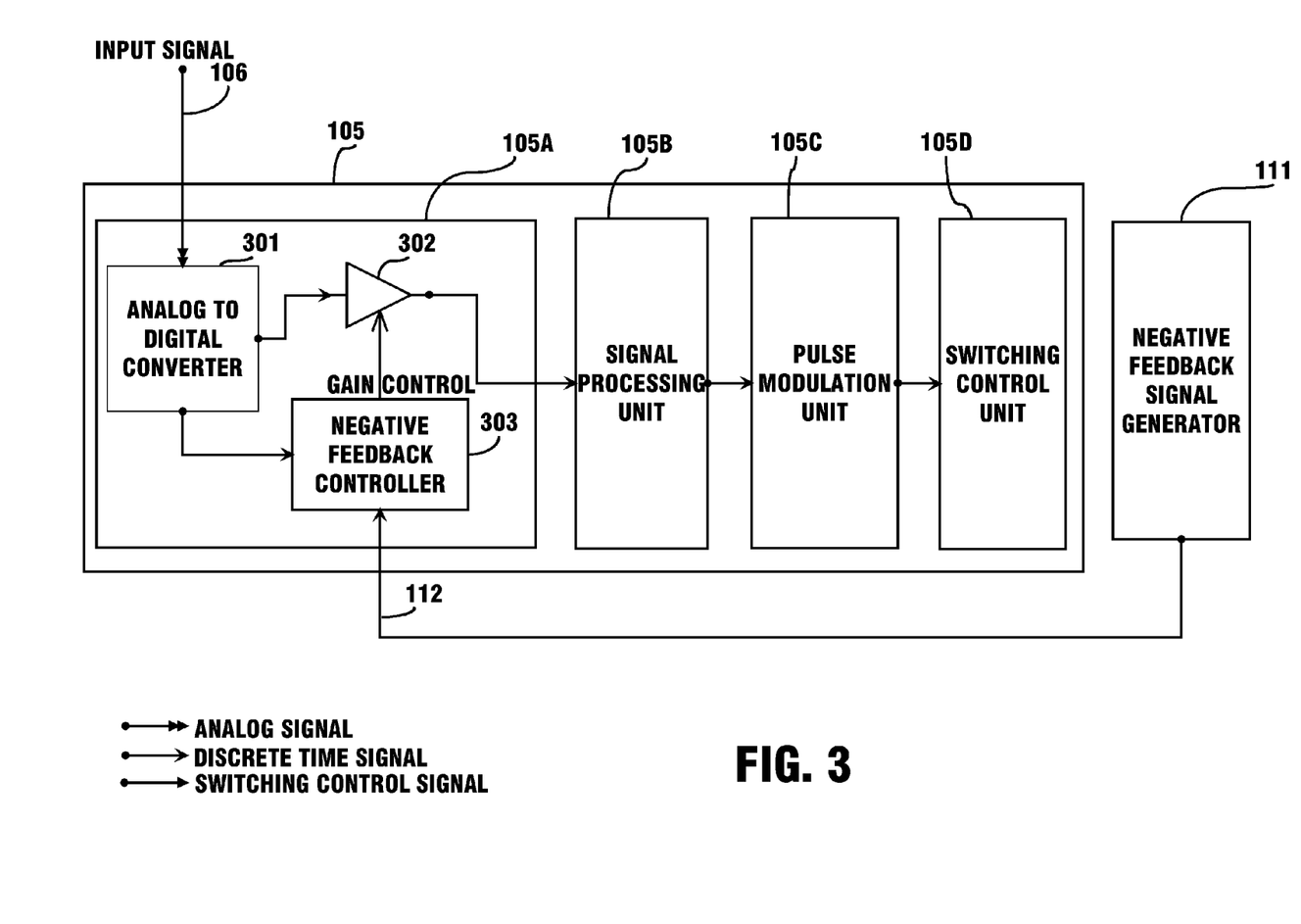
FIG. 3 is an exemplary block and circuit diagram illustrating an embodiment of the amplifier control unit integrating an input signal and a negative feedback signal in FIGS. 1, 4 and 5 in accordance with the present invention.

FIG. 3 is an exemplary block and circuit diagram illustrating an embodiment of the amplifier control unit 105 integrating the input signal 106 and a negative feedback signal 112 in FIGS. 1, 4 and 5 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n<\infty$$

to get a compensated discrete time signal X[n] and sends the compensated discrete time signal X[n] to the signal processing unit 105B.

Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$$y[n]=\sqrt[2]{X[n]}, 0<n<\infty.$$

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

Figure 4:
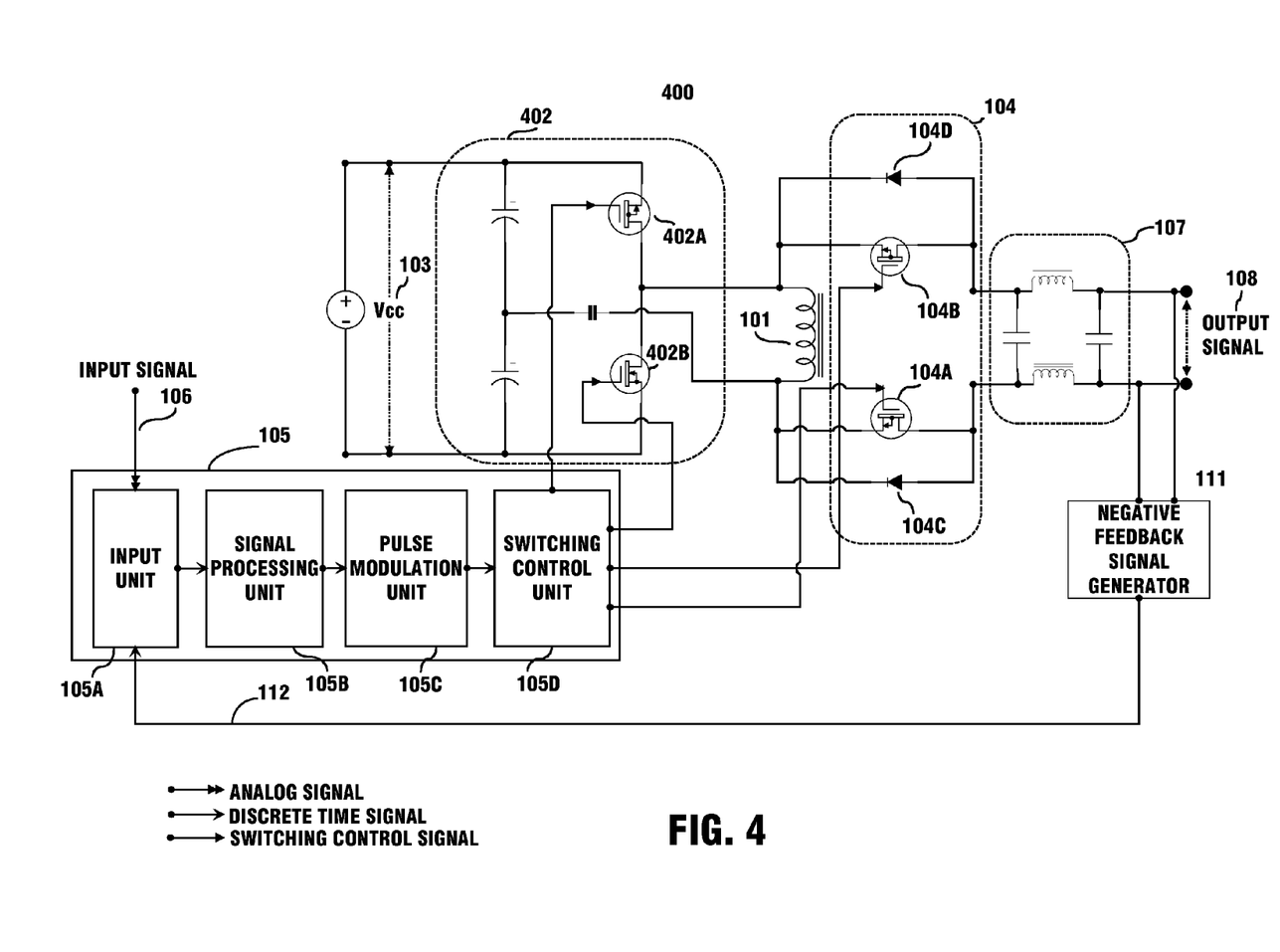
FIG. 4 is an exemplary block and circuit diagram illustrating an embodiment of a switching amplifier in accordance with the present invention, wherein the switching amplifier has switches configured as a half bridge topology.

FIG. 4 is an exemplary block and circuit diagram illustrating an embodiment of a switching amplifier 400 in accordance with the present invention, wherein the switching amplifier 400 having switches 402A and 402B configured as a half bridge topology.

As illustrated in FIG. 4, the switching amplifier 400 of the present invention for amplifying an input signal 106 having positive and negative polarities is comprised of: a inductor means 101; a switching unit 402 comprising two switches 402A and 402B configured as a half bridge topology coupled to the inductor means 101 for switching a current from a direct current (DC) voltage 103 to the inductor means 101; a controllable diodes unit 104 coupled to inductor means 101; an amplifier control unit 105 for receiving the input signal 106 and coupled to the switches 402A and 402B of the switching unit 402 and the switches 104A and 104B of the controllable diodes unit 104 for controlling their switching; a filter unit 107 coupled to the controllable diodes unit 104.

As further illustrated in FIG. 4, the amplifier control unit 105 comprises an input unit 105A for receiving the input signal 106 and converting the input signal 106 to a discrete time input signal; a signal processing unit 105B for transforming the discrete time input signal and outputting a transformed signal, as previously illustrated in FIG. 1; a pulse modulation unit 105C for getting a pulse modulated signal from pulse modulating the transformed signal from the signal processing unit 105B; and a switching control unit 105D coupled to the switches 402A and 402B of the switching unit 402 and the switches 104A and 104B of the controllable diodes unit 104 to control their switching according to the pulse modulated signal from the pulse modulation unit 105C.

As illustrated in FIG. 4 and FIG. 2, a non-limiting exemplary waveform for the pulse modulated signal outputting from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), non-limiting exemplary waveforms of switching control signals from the switching control unit 105D to the switches 402A and 402B for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 4 and FIG. 2, when the input signal 106 is zero, the switches of the switching unit 402 and the controllable diodes unit 104 are all switched off. When the input signal 106 is not zero, the switches 402A and 402B switch the current from the direct current (DC) voltage 103 to the inductor means 101 according to the pulse modulated signal transformed and pulse modulated from the input signal 106, and the switches 104A and 104B switch for blocking the current from the inductor means 101 to the filter unit 107 when the current from the direct current (DC) voltage 103 to the inductor means 101 is switched on by the switching unit 402, and conducting the current from the inductor means 101 to the filter unit 107 when the current from the direct current (DC) voltage 103 to the inductor means 101 is switched off.

As further illustrated in FIG. 4, the filter unit 107 is a low pass filter to obtain the output signal 108 corresponding to the input signal 106 by filtering the output of the controllable diodes unit 104 and outputting the output signal 108.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

Figure 5:
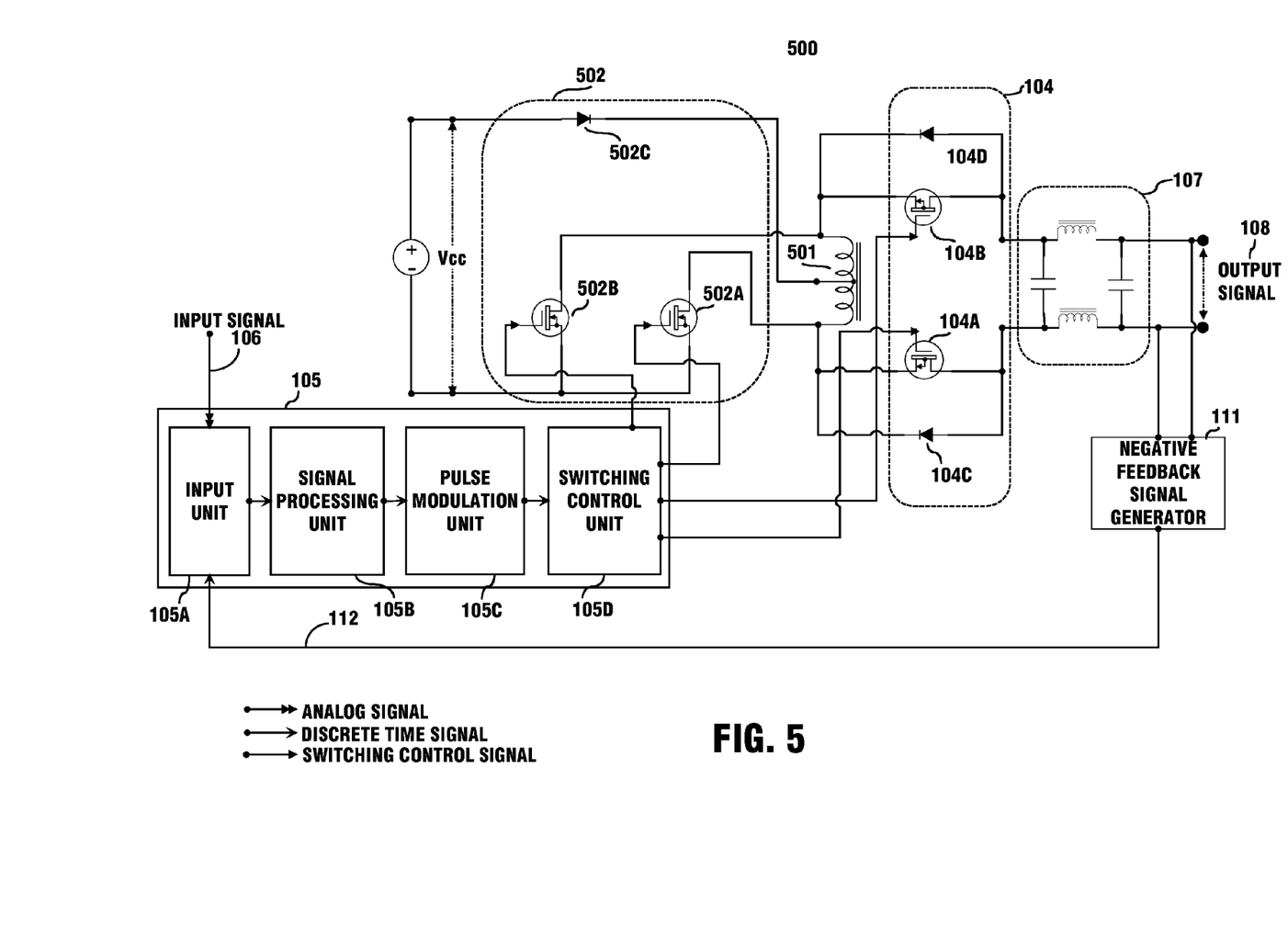
FIG. 5 is an exemplary block and circuit diagram illustrating an embodiment of a switching amplifier in accordance with the present invention, wherein the switching amplifier has switches configured as a push pull topology.

FIG. 5 is an exemplary block and circuit diagram illustrating an embodiment of a switching amplifier 500 in accordance with the present invention, wherein the switching amplifier 500 has switches 502A and 502B configured as a push pull topology.

As illustrated in FIG. 5, the switching amplifier 500 of the present invention for amplifying an input signal 106 having positive and negative polarities is comprised of: an inductor means 501; a switching unit 502 comprising two switches 502A and 502B configured as a push pull topology and coupled to the inductor means 501 for switching a current from a direct current (DC) voltage 103 to the inductor means 501; a diode 502C for preventing a current flow from the inductor means 501 to the direct current (DC) voltage 103; a controllable diodes unit 104 coupled to the inductor means 501; an amplifier control unit 105 for receiving the input signal 106 and coupled to the switches 502A and 502B of the switching unit 502 and the switches 104A and 104B of the controllable diodes unit 104 for controlling their switching; a filter unit 107 coupled to the controllable diodes unit 104.

As further illustrated in FIG. 5, the amplifier control unit 105 comprises an input unit 105A for receiving the input signal 106 and converting the input signal 106 to a discrete time input signal; a signal processing unit 105B for transforming the discrete time input signal and outputting a transformed signal, as previously illustrated in FIG. 1; a pulse modulation unit 105C for getting a pulse modulated signal from pulse modulating the transformed signal from the signal processing unit 105B; and a switching control unit 105D coupled to the switches 502A, and 502B of the switching unit 502 and the switches 104A and 104B of the controllable diodes unit 104 to control their switching according to the pulse modulated signal from the pulse modulation unit 105C.

As illustrated in FIG. 5 and FIG. 2, a non-limiting exemplary waveform for the pulse modulated signal outputting from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), non-limiting exemplary waveforms of switching control signals from the switching control unit 105D to the switches 502A and 502B for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 5 and FIG. 2, when the input signal 106 is zero, the switches of the switching unit 502 and the controllable diodes unit 104 are all switched off. When the input signal 106 is not zero, the switches 502A and 502B switch a current from the direct current (DC) voltage 103 to the inductor means 501 according to the pulse modulated signal transformed and pulse modulated from the input signal 106, and the switches 104A and 104B switch for blocking the current from the inductor means 501 to the filter unit 107 when the current from the direct current (DC) voltage 103 to the inductor means 501 is switched on by the switching unit 502, and conducting the current from the inductor means 501 to the filter unit 107 when the current from the direct current (DC) voltage 103 to the inductor means 501 is switched off.

As further illustrated in FIG. 5, the filter unit 107 is a low pass filter to obtain the output signal 108 corresponding to the input signal 106 by filtering the output of the controllable diodes unit 104 and outputting the output signal 108.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

From the switching amplifiers 100, 400 and 500 in accordance with the present invention, one aspect of the present invention provides a switching amplifier that is highly efficient and without the "dead time" problem related to the class D amplifiers. Accordingly, the switches of the switching amplifiers 100, 400 and 500 are never short the direct current (DC) voltage 103 through themselves.

From the switching amplifiers 100, 400 and 500 in accordance with the present invention, another aspect of the present invention provides a switching amplifier that is completely off when there is no input signal, as illustrated in FIG. 2.

From the switching amplifiers 100, 400 and 500 in accordance with the present invention, yet another aspect of the present invention provides a switching amplifier comprised of an act of comparing an input signal with an output feedback signal for detection and correction of overall system signal processes therefore does not require a power supply regulator and is substantially immune to power supply and load perturbations, as illustrated in FIGS. 1, 3, 4 and 5.

It is to be understood that the above described embodiments are merely illustrative of the principles of the invention and that other arrangements may be devised by those skilled in the art without departing from the spirit and scope of the invention.

What is claimed is:

1. A method of obtaining an output signal from a direct current (DC) voltage, wherein the output signal is a linearly amplified replica of an input signal having first and second polarities, comprising the steps of:
  receiving the input signal;
  transforming and pulse modulating the input signal for generating a pulse modulated signal, wherein said transforming is based on that when applying the direct current (DC) voltage across an inductor means, the energy stored in the inductor means is proportional to square of time of said applying;
  switching a current from the direct current (DC) voltage to the inductor means according to the pulse modulated signal;
  blocking a current from the inductor means to a filter when the current from the direct current (DC) voltage to the inductor means is switched on and conducting the current from the inductor means to the filter when the current from the direct current (DC) voltage to the inductor means is switched off;
  filtering said current from the inductor means for outputting the output signal by the filter.

2. The method of claim 1 further comprising:
  getting a feedback signal by detecting the output signal and integrating the feedback signal to process a negative feedback control.

3. A switching amplifier for amplifying an input signal having first and second polarities, said amplifier comprising:
  an inductor means;
  a switching unit coupled to the inductor means for switching a current from a direct current (DC) voltage to the inductor means;
  a controllable diodes unit coupled between the inductor means and a filter unit for blocking a current from the inductor means to the filter unit when the current from the direct current (DC) voltage to the inductor means is switched on by the switching unit, and conducting the current from the inductor means to the filter unit when the current from the direct current (DC) voltage to the inductor means is switched off;

an amplifier control unit for receiving the input signal and coupled to the switching unit and the controllable diodes unit to control their switching according to the input signal;

the filter unit to obtain an output signal corresponding to the input signal by filtering the output of the controllable diodes unit and outputting the output signal.

4. The switching amplifier according to claim 3, further comprising:

a negative feedback signal generator to generate a negative feedback signal corresponding to the output signal, wherein the amplifier control unit integrates the input signal and the negative feedback signal to process a negative feedback control.

5. The switching amplifier according to claim 3, wherein the switching unit comprises a plurality of switches configured as a full bridge topology.

6. The switching amplifier according to claim 3, wherein the switching unit comprises a plurality of switches configured as a half bridge topology.

7. The switching amplifier according to claim 3, wherein the switching unit comprises a plurality of switches configured as a push pull topology.

8. The switching amplifier according to claim 3, wherein the controllable diodes unit comprises two switches and two diode means.

9. The switching amplifier according to claim 8, wherein the diode means is a diode.

10. The switching amplifier according to claim 8, wherein the diode means is a synchronous switch.

11. The switching amplifier according to claim 3, wherein the controllable diodes unit comprises two switches.

12. The switching amplifier according to claim 3, wherein the controllable diodes unit comprises one switch that can switch off an alternating current.

13. The switching amplifier according to claim 3, wherein the input signal is an analog signal.

14. The switching amplifier according to claim 3, wherein the input signal is a discrete time signal.

15. The switching amplifier according to claim 3, wherein the filter unit is a low pass filter.

16. The switching amplifier according to claim 3, wherein the filter unit is a band pass filter.

17. The switching amplifier according to claim 3, wherein the filter unit is a band stop filter.

* * * * *